United States Patent [19]

West et al.

[11] Patent Number: 5,043,250

[45] Date of Patent: Aug. 27, 1991

[54] RADIATION-SENSITIVE COMPOSITION CONTAINING A POLY (N-ACYL-ALKYLENEIMINE) AND USE THEREOF IN LITHOGRAPHIC PRINTING PLATES

[75] Inventors: Paul R. West, Fort Collins; James E. Mitchell, Windsor; Gary R. Miller, Fort Collins; Paul R. Josephson, Jr., Fort Collins; Jr., Raymond W. Ryan, Fort Collins, all of Colo.

[73] Assignee: Eastman Kodak Company, Rochester, N.Y.

[21] Appl. No.: 554,239

[22] Filed: Jul. 17, 1990

[51] Int. Cl.$^5$ .................. G03C 1/77; G03F 7/004
[52] U.S. Cl. .................. 430/278; 430/285; 430/302; 430/281
[58] Field of Search ............... 430/302, 285, 278, 281

[56] References Cited

U.S. PATENT DOCUMENTS

| | | | |
|---|---|---|---|
| 3,483,141 | 12/1969 | Litt et al. | 528/402 |
| 3,929,489 | 12/1975 | Arcesi et al. | 430/278 |
| 4,139,390 | 2/1979 | Rauner et al. | 430/285 |
| 4,173,474 | 11/1979 | Tanaka et al. | 430/306 |
| 4,419,437 | 12/1983 | Noonan et al. | 430/270 |
| 4,425,424 | 1/1984 | Altland et al. | 430/270 |
| 4,606,994 | 8/1986 | Illers et al. | 430/285 |
| 4,696,876 | 9/1987 | Cael | 430/281 |
| 4,865,951 | 9/1989 | Huddleston et al. | 430/302 |

*Primary Examiner*—Marion E. McCamish
*Assistant Examiner*—Christopher D. RoDee
*Attorney, Agent, or Firm*—Alfred P. Lorenzo

[57] ABSTRACT

Radiation-sensitive compositions which are especially useful in the production of negative-working lithographic printing plates comprise a photocrosslinkable polymer containing the photosensitive group

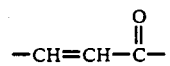

as an integral part of the polymer backbone and, in an amount sufficient to improve the properties of the composition, a poly(N-acyl-alkleneimine). The poly(N-acyl-alkyleneimine) improves the properties of the radiation-sensitive composition in regard to such factors as shelf life, image contrast, developability and reduction in mottle and thereby provides a superior lithographic printing plate.

12 Claims, No Drawings

RADIATION-SENSITIVE COMPOSITION CONTAINING A POLY (N-ACYL-ALKYLENEIMINE) AND USE THEREOF IN LITHOGRAPHIC PRINTING PLATES

FIELD OF THE INVENTION

This invention relates in general to radiation-sensitive compositions and in particular to radiation-sensitive compositions which contain a photocrosslinkable polymer. More specifically, this invention relates to novel radiation-sensitive compositions which are especially useful in the production of lithographic printing plates.

BACKGROUND OF THE INVENTION

The art of lithographic printing is based upon the immiscibility of oil and water, wherein the oily material or ink is preferentially retained by the image area and the water or fountain solution is preferentially retained by the non-image area. When a suitably prepared surface is moistened with water and an ink is then applied, the background or non-image area retains the water and repels the ink while the image area accepts the ink and repels the water. The ink on the image area is then transferred to the surface of a material upon which the image is to be reproduced, such as paper, cloth and the like. Commonly the ink is transferred to an intermediate material called the blanket, which in turn transfers the ink to the surface of the material upon which the image is to be reproduced.

Negative-working lithographic printing plates are prepared from negative-working radiation-sensitive compositions that are formed from polymers which crosslink in radiation-exposed areas. A developing solution is used to remove the unexposed portions of the coating to thereby form a negative image.

The most widely used type of negative-working lithographic printing plate comprises a layer of a radiation-sensitive composition applied to an aluminum substrate and commonly includes a subbing layer or interlayer to control the bonding of the radiation-sensitive layer to the substrate. The aluminum substrate is typically provided with an anodized coating formed by anodically oxidizing the aluminum in an aqueous electrolyte solution.

It is well known to prepare negative-working lithographic printing plates utilizing a radiation-sensitive composition which includes a photocrosslinkable polymer containing the photosensitive group:

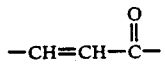

as an integral part of the polymer backbone. (See, for example, U.S. Pat. Nos. 3,030,208, 3,622,320, 3,702,765 and 3,929,489). A typical example of such a photocrosslinkable polymer is the polyester prepared from diethyl p-phenylenediacrylate and 1,4-bis($\beta$-hydroxyethoxy)-cyclohexane, which is comprised of recurring units of the formula:

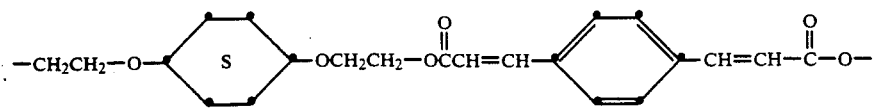

This polyester, referred to hereinafter as Polymer A, has been employed for many years in lithographic printing plates which have been extensively used on a commercial basis. These printing plates have typically employed an anodized aluminum substrate which has been formed by electrolytic anodization with an electrolyte comprised of phosphoric acid.

Polyesters in addition to Polymer A which are especially useful in the preparation of lithographic printing plates are those which incorporate ionic moieties derived from monomers such as dimethyl-3,3'-[(sodioimino)disulfonyl]dibenzoate and dimethyl-5-sodiosulfoisophthalate. Polyesters of this type are well known and are described, for example, in U.S. Pat. No. 3,929,489 issued Dec. 30, 1975. A preferred polyester of this type, referred to hereinafter as Polymer B, is poly[1,4-cyclohexylene-bis(oxyethylene)-p-phenylenediacrylate]-co-3,3'-[(sodioimino)disulfonyl]dibenzoate.
Another preferred polyester of this type, referred to hereinafter as Polymer C, is poly[1,4-cyclohexylene-bis-(oxyethylene)-p-phenylenediacrylate]-co-3,3'-[(sodioimino)disulfonyl]dibenzoate-co-3-hydroxyisophthalate.

While lithographic printing plates prepared from photocrosslinkable polymers such as Polymer A, Polymer B or Polymer C have many advantageous properties, they suffer from certain deficiencies which have limited their commercial acceptance. Thus, for example, shelf-life can be inadequate in that significant scumming in the background areas tends to manifest itself upon aging of the plate without special treatments of the support. As described in Cunningham et al, U.S. Pat. No. 3,860,426, shelf-life is enhanced by overcoating the phosphoric-acid-anodized aluminum substrate with a subbing layer containing a salt of a heavy metal, such as zinc acetate, dispersed in a hydrophilic cellulosic material such as carboxymethylcellulose. As described in European Patent Application No. 0218160, published Apr. 15, 1987, shelf-life can also be enhanced by applying a silicate layer over the anodic layer and then subjecting the silicate layer to a passivating treatment with a salt of a heavy metal, such as zinc acetate.

Omitting the use of such overcoating or passivating treatment of the substrate results in an increasing amount of coating residue on the plate following development as the plate ages, i.e., shelf-life is inadequate. However, the presence of zinc or other heavy metals in the printing plate in extractable form is undesirable because of the potential of contaminating the developer to the point that it can no longer be legally discharged into municipal sewage systems. Moreover, even with zinc acetate passivation or the addition of zinc acetate to a cellulosic subbing layer, the presensitized printing plates exhibit a substantial increase in toe speed on aging which results in undesirably low contrast.

A further disadvantage of the aforesaid photopolymer coatings is that the quantity of coating which can be processed with a given quantity of aqueous developer is less than desirable due to the fact that the coating breaks-up as fairly large particles which tend to redeposit on the imaged areas of the printing plate. The photopolymer coatings can be caused to break-up into finer particles upon development by drying them at higher temperatures than normally used. The use of higher drying temperatures, however, increases manufacturing costs and decreases production efficiency. Furthermore, although the particle sizes are finer, the quantity of photopolymer coating which can be processed before redeposit begins to occur is still less than desirable.

Other disadvantages associated with the use of the aforesaid photopolymers in lithographic printing plates include a tendency for undesirable mottle formation to occur and the need to use an undesirably high concentration of organic solvent in an aqueous-based developing composition. Mottle is particularly affected by the mechanics of film drying, determined by such factors as solvent evaporation rates.

Blinding problems are commonly encountered with commercially available aqueous-developable lithographic printing plates, so that there is an acute need in the art for an additive that is capable of improving ink receptivity.

It is known to incorporate non-light-sensitive, film-forming, resins in radiation-sensitive compositions of the type described hereinabove. For example, U.S. Pat. No. 3,929,489 refers to the use of phenolic resins, epoxy resins, hydrogenated rosin, poly(vinyl acetals), acrylic polymers, poly(alkylene oxides), and poly(vinyl alcohol) and U.S. Pat. No. 4,425,424 specifically discloses the use of polystyrene resin. These resins are employed for such purposes as controlling wear resistance of the coating, improving resistance to etchants and increasing the thickness of the radiation-sensitive layer so as to ensure complete coverage of the relatively rough metal substrate and thereby prevent blinding. However, these resins do not impart beneficial properties with respect to shelf-life or processing characteristics.

It is toward the objective of providing an improved radiation-sensitive composition, useful in the production of lithographic printing plates, that overcomes one or more of the disadvantages described above that the present invention is directed.

SUMMARY OF THE INVENTION

In accordance with this invention, a poly(N-acyl-alkyleneimine) is incorporated in a radiation-sensitive composition which includes a photocrosslinkable polymer containing the photosensitive group.

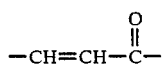

as an integral part of the polymer backbone. The poly(N-acyl-alkyleneimine) improves the properties of the radiation-sensitive composition in regard to such factors as shelf-life, image contrast, developability and reduction of mottle and thereby provides a superior negative-working lithographic printing plate.

DESCRIPTION OF THE PREFERRED EMBODIMENTS

The following copending commonly assigned U.S. patent applications are directed to inventions which are closely related to that described herein:

(1) U.S. patent application Ser. No. 554,232, filed July 17, 1990, pending "Radiation-Sensitive Composition Containing a Vinyl Pyrrolidone Polymer and Use Thereof in Lithographic Printing Plates" by Paul R. West et al.

(2) U.S. patent application Ser. No. 554,231, filed July 17, 1990, pending "Radiation-Sensitive Composition Containing An Unsaturated Polyester and Use Thereof in Lithographic Printing Plates" by Paul R. West et al.

(3) U.S. patent application Ser. No. 554,230, filed July 17, 1990, pending "Radiation-Sensitive Composition Containing Both a Vinyl Pyrrolidone Polymer and An Unsaturated Polyester and Use Thereof in Lithographic Printing Plates" by Paul R. West et al.

and (4) U.S. patent application Ser. No. 554,229, filed July 17, 1990, pending "Radiation-Sensitive Composition Containing Both a Poly(N-Acyl-Alkyleneimine) and An Unsaturated Polyester and Use Thereof in Lithographic Printing Plates" by Paul R. West et al.

As indicated hereinabove, the radiation-sensitive compositions of this invention contain a poly(N-acyl-alkyleneimine).

The poly(N-acyl-alkyleneimines) are well known polymers, some of which are commercially available, and are described in, for example, U.S. Pat. Nos. 3,470,267, 3,484,141, 3,640,909 and 4,474,928. They range in molecular weight from several thousand to several hundred thousand.

The poly(N-acyl-alkyleneimines) utilized in this invention include polymers comprised of repeating units of the formula:

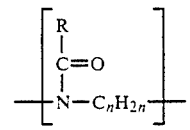

wherein R is a monovalent hydrocarbyl radical containing up to 20 carbon atoms and n is an integer with a value of 2 to 4. The hydrocarbyl radical represented by R can be unsubstituted or substituted with substituents such as halo, haloalkyl, hydroxyalkyl, and the like.

The poly(N-acyl-alkyleneimines) can be prepared by the ring-opening polymerization of heterocyclic monomers of the formula

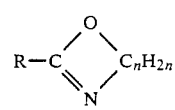

wherein R and n are as defined above. For example, N-acylated polyethyleneimines of the structure

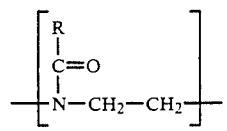

are advantageously prepared from oxazolines of the formula:

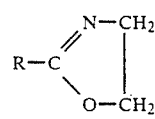

As indicated above, R can be any monovalent hydrocarbyl radical, substituted or unsubstituted, containing up to 20 carbon atoms including alkyl such as ethyl, halogenated alkyl such as dichloroethyl, aryl such as phenyl, halogenated aryl such as p-bromophenyl, aralkyl such as benzyl, cycloalkyl such as cyclohexyl and alkaryl such as tolyl.

Examples of the many different poly(N-acyl-alkyleneimines) include
poly(N-acetyl ethyleneimine)
poly(N-propionyl ethyleneimine)
poly(N-butyryl ethyleneimine)
poly(N-acetyl trimethyleneimine)
poly(N-propionyl trimethyleneimine)
poly(N-butyryl trimethyleneimine)
poly(N-hexanoyl trimethyleneimine)
poly(N-undecanoyl trimethyleneimine)
and the like.

The preferred poly(N-acyl-alkyleneimine) for use in this invention is poly(N-propionyl ethyleneimine). An alternative name for this polymer is poly(2-ethyl-2-oxazoline). It is available from the Dow Chemical Company under the trademark PEOX Polymer, with polymers of different molecular weight available as PEOX 50, PEOX 250 and PEOX 500.

The poly(N-acyl-alkyleneimine) is typically incorporated in the radiation-sensitive composition in an amount of from about 2 to about 30 percent by weight based on total polymer content, and more particularly in an amount of from about 5 to about 15 percent by weight.

The radiation-sensitive compositions of this invention comprise photocrosslinkable polymers, such as polyesters, containing the photosensitive group

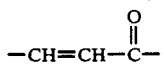

as an integral part of the polymer backbone. For example, preferred photocrosslinkable polymers are polyesters prepared from one or more compounds represented by the following formulae:

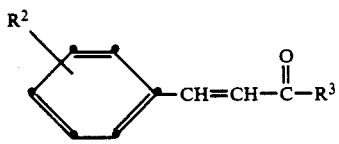
(A)

where $R^2$ is one or more alkyl of 1 to 6 carbon atoms, aryl of 6 to 12 carbon atoms, aralkyl of 7 to 20 carbon atoms, alkoxy of 1 to 6 carbon atoms, nitro, amino, acrylic, carboxyl, hydrogen or halo and is chosen to provide at least one condensation site; and $R^3$ is hydroxy, alkoxy of 1 to 6 carbon atoms, halo or oxy if the compound is an acid anhydride. A preferred compound is p-phenylene diacrylic acid or a functional equivalent thereof. These and other useful compounds are described in U.S. Pat. No. 3,030,208 (issued Apr. 17, 1962 to Schellenberg et al); U.S. Pat. No. 3,702,765 (issued Nov. 14, 1972 to Laakso); and U.S. Pat. No. 3,622,320 (issued Nov. 23, 1971 to Allen), the disclosures of which are incorporated herein by reference.

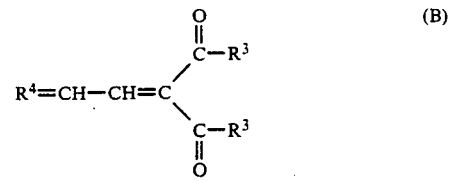
(B)

$R^3$ is as defined above, and $R^4$ is alkylidene of 1 to 4 carbon atoms, aralkylidene of 7 to 16 carbon atoms, or a 5- to 6-membered heterocyclic ring. Particularly useful compounds of formula (B) are cinnamylidenemalonic acid, 2-butenylidenemalonic acid, 3-pentenylidenemalonic acid, o-nitrocinnamylidene malonic acid, naphthylallylidenemalonic acid, 2-furfurylideneethylidenemalonic acid and functional equivalents thereof. These and other useful compounds are described in U.S. Pat. No. 3,674,745 (issued July 4, 1972 to Philipot et al), the disclosure of which is incorporated herein by reference.

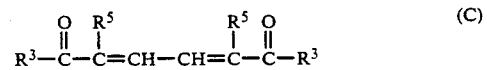
(C)

$R^3$ is as defined above; and $R^5$ is hydrogen or methyl. Particularly useful compounds of formula (C) are trans, trans-muconic acid, cis-transmuconic acid, cis, cis-muconic acid, $\alpha,\alpha'$-cis, trans-dimethylmuconic acid, $\alpha,\alpha'$-cis, cis-dimethylmuconic acid and functional equivalents thereof. These and other useful compounds are described in U.S. Pat. No. 3,615,434 (issued Oct. 26, 1971 to McConkey), the disclosure of which is incorporated herein by reference.

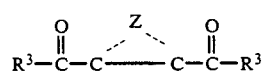
(D)

$R^3$ is as defined above; and Z represents the atoms necessary to form an unsaturated bridged or unbridged carbocyclic nucleus of 6 to 7 carbon atoms. Such nucleus can be substituted or unsubstituted. Particularly useful compounds of formula (D) are 4-cyclohexene-1,2-dicarboxylic acid, 5-norbornene-2,3-dicarboxylic acid, hexachloro-5[2:2:1]-bicycloheptene-2,3-dicarboxylic acid and functional equivalents thereof. These and other useful compounds are described in Canadian Patent No. 824,096 (issued Sept. 30, 1969 to Mench et al), the disclosure of which is incorporated herein by reference.

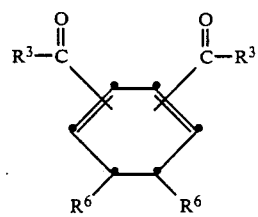
(E)

$R^3$ is as defined above; and $R^6$ is hydrogen, alkyl 1 to 12 carbon atoms, cycloalkyl of 5 to 12 carbon atoms or aryl of 6 to 12 carbon atoms. $R^6$ can be substituted where possible, with such substituents as do not interfere with the condensation reaction, such as halo, nitro, aryl, alkoxy, aryloxy, etc. The carbonyl groups are attached to the cyclohexadiene nucleus meta or para to each other, and preferably para. Particularly useful compounds of formula (E) are 1,3-cyclohexadiene-1,4-dicarboxylic acid, 1,3-cyclohexadiene-1,3-dicarboxylic acid, 1,5-cyclohexadiene-1,4-dicarboxylic acid and functional equivalents thereof. These and other useful compounds are described in Belgian Patent No. 754,892 (issued Oct. 15, 1970), the disclosure of which is incorporated herein by reference.

Preferred photocrosslinkable polyesters for use in this invention are p-phenylene diacrylate polyesters.

Printing plates of this invention comprise a support having coated thereon a layer containing the radiation-sensitive composition described above. Such plates can be prepared by forming coatings with the coating composition and removing the solvent by drying at ambient or elevated temperatures. Any one of a variety of conventional coating techniques can be employed, such as extrusion coating, doctor-blade coating, spray coating, dip coating, whirl coating, spin coating, roller coating, etc.

Coating compositions containing the mixture of polymers of this invention can be prepared by dispersing or dissolving the polymers in any suitable solvent or combination of solvents used in the art to prepare polymer dopes. The solvents are chosen to be substantially unreactive toward the polymers within the time period contemplated for maintaining the solvent and polymer in association and are chosen to be compatible with the substrate employed for coating. While the best choice of solvent will vary with the exact application under consideration, exemplary preferred solvents include alcohols, such as butanol and benzyl alcohol; ketones, such as acetone, 2-butanone and cyclohexanone; ethers, such as tetrahydrofuran and dioxane; 2-methoxyethyl acetate; N,N'-dimethylformamide; chlorinated hydrocarbons such as chloroform, trichloroethane, 1,2-dichloroethane, 1,1-dichloroethane, 1,1,2-trichloroethane, dichloromethane, tetrachloroethane, chlorobenzene; and mixtures thereof.

Suitable supports can be chosen from among a variety of materials which do not directly chemically react with the coating composition. Such supports include fiber based materials such as paper, polyethylene-coated paper, polypropylene-coated paper, parchment, cloth, etc.; sheets and foils of such materials as aluminum, copper, magnesium zinc, etc.; glass and glass coated with such metals as chromium alloys, steel, silver, gold, platinum, etc.; synthetic resin and polymeric materials such as poly(alkyl acrylates), e.g., poly(methyl methacrylate), polyester film base, e.g., poly(ethylene terephthalate), poly(vinyl acetals), polyamides, e.g., nylon and cellulose ester film base, e.g., cellulose nitrate, cellulose acetate, cellulose acetate propionate, cellulose acetate butyrate and the like.

Preferred support materials include zinc, anodized aluminum, grained aluminum, and aluminum which has been grained and anodized. Particularly preferred support materials are described in Miller et al, U.S. Pat. No. 4,647,346, issued Mar. 3, 1987, and Huddleston et al, U.S. Pat. No. 4,865,951, issued Sept. 12, 1989.

The support can be preliminarily coated— i.e., before receipt of the radiation-sensitive coating—with known subbing layers such as copolymers of vinylidene chloride and acrylic monomers—e.g., acrylonitrile, methyl acrylate, etc. and unsaturated dicarboxylic acids such as itaconic acid, etc.; carboxymethyl cellulose, gelatin; polyacrylamide; and similar polymer materials. A preferred subbing composition comprises benzoic acid and is described in Miller et al, U.S. Pat. No. 4,640,886, issued Feb. 3, 1987.

The optimum coating thickness of the radiation-sensitive layer will depend upon such factors as the particular application to which the printing plate will be put, and the nature of other components which may be present in the coating. Typical coating thicknesses can be from about 0.05 to about 10.0 microns or greater, with thicknesses of from 0.1 to 2.5 microns being preferred.

The printing plate of this invention can be exposed by conventional methods, for example, through a transparency or a stencil, to an imagewise pattern of actinic radiation, preferably rich in ultraviolet light, which crosslinks and insolubilizes the radiation-sensitive polymer in the exposed areas. Suitable light sources include carbon arc lamps, mercury vapor lamps, fluorescent lamps, tungsten filament lamps, "photoflood" lamps, lasers and the like. The exposure can be by contact printing techniques, by lens projection, by reflex, by bireflex, from an image-bearing original or by any other known technique.

The exposed printing plate of this invention can be developed by flushing, soaking, swabbing or otherwise treating the radiation-sensitive composition with a solution (hereinafter referred to as a developer) which selectively solubilizes (i.e., removes) the unexposed areas of the radiation-sensitive layer. The developer is preferably an aqueous solution having a pH as near to neutral as is feasible.

In a preferred form, the developer includes a combination of water and an alcohol that is miscible with water, or able to be rendered miscible by the use of cosolvents or surfactants, as a solvent system. The proportions of water and alcohol can be varied widely but are typically within the range of from 40 to 99 percent by volume water and from 1 to 60 percent by volume alcohol. Most preferably, the water content is maintained within the range of from 60 to 90 percent by volume. Any alcohol or combination of alcohols that does not chemically adversely attack the cross-linked radiation-sensitive layer during development and that is miscible with water in the proportions chosen for use can be employed. Exemplary of useful alcohols are glycerol, benzyl alcohol, 2-phenoxyethanol, 1,2-propanediol, sec-butyl alcohol and ethers derived from alkylene glycols—i.e., dihydroxy poly(alkylene oxides-)—e.g., dihydroxy poly(ethylene oxide), dihydroxy poly(propylene oxide), etc.

It is recognized that the developer can, optionally, contain additional addenda. For example, the developer can contain dyes and/or pigments. It can be advantageous to incorporate into the developer anti-scumming and/or anti-blinding agents as is well recognized in the art.

A preferred developing composition for use with the novel lithographic printing plates of this invention is an aqueous composition including:

(a) a nontoxic developing vehicle, such as butyrolactone, phenoxy propanol, phenoxy ethanol, benzyl alcohol or methyl pyrrolidone, which is a non-solvent for any of the components of the lithographic plate;

(b) a first surfactant comprising a sodium, lithium or potassium salt of xylene sulfonic acid;

(c) a second surfactant comprising a sodium, lithium or potassium salt of toluene, ethyl benzene, cumene or mesitylene sulfonic acid;

(d) a third surfactant comprising a sodium, lithium or potassium salt of an alkyl benzene sulfonic acid, the alkyl group containing at least ten carbon atoms, or an alkyl naphthalene sulfonic acid, the alkyl group containing from one to four carbon atoms;

(e) a cold water soluble film-forming agent such as polyvinyl pyrrolidone, polystyrene/maleic anhydride copolymers, polyvinyl alcohol, polyvinyl methyl ethers and polystyrene/vinyl acetate copolymers;

(f) an alkanolamine desensitizing agent such as diethanolamine;

and (g) an acid, such as citric, ascorbic, tartaric, glutaric, acetic, phosphoric, sulfuric or hydrochloric acid, to control the pH of the developing composition.

These developing compositions are described in copending commonly assigned U.S. patent application Ser. No. 379,823, filed July 14, 1989, "Aqueous Developer Composition For Developing Negative-Working Lithographic Printing Plates", by J. E. Walls, the disclosure of which is incorporated herein by reference. A developing composition of this type is commercially available from Eastman Kodak Company, Rochester, N.Y., as KODAK AQUEOUS PLATE DEVELOPER MX-1469-1.

After development, the printing plate can be treated in any known manner consistent with its intended use. For example, lithographic printing plates are typically subjected to desensitizing etches.

In addition to the photocrosslinkable polymer and the poly(N-acyl-alkyleneimine), a number of other addenda can be present in the coating composition and ultimately form a part of the completed printing plate. For example, radiation sensitivity of the radiation-sensitive polymeric composition can be enhanced by incorporating therein one or more spectral sensitizers. Suitable spectral sensitizers include anthrones, nitro sensitizers, triphenylmethanes, quinones, cyanine dyes, naphthones, pyrylium and thiapyrylium salts, furanones, anthraquinones, 3-ketocoumarins, thiazoles, thiazolines, naphthothiazolines, quinalizones, and others described in U.S. Pat. No. 4,139,390 and references noted therein. Preferred sensitizers include the 3-ketocoumarins described in U.S. Pat. No. 4,147,552 and the thiazoline sensitizers of U.S. Pat. No. 4,062,686. Such sensitizers can be present in the compositions in effective sensitizing amounts easily determined by one of the ordinary skill in the art.

The coating composition can contain pigments preferably having a maximum average particle size less than about 3 micrometers. These pigments can provide a visible coloration to an image before or after development of the element. Useful pigments are well known in the art and include titanium dioxide, zinc oxide, copper phthalocyanines, halogenated copper phthalocyanines, quinacridine, and colorants such as those sold commercially under such trade names as Monastral Blue and Monastral Red B. The pigments are generally present in the compositions in an amount within the range of from 0 to about 50 percent (by weight) based on the total dry composition weight. Preferred amounts are within the range of from about 5 to about 20 percent (by weight).

It is frequently desirable to add print out or indicator dyes to the compositions to provide a colored print out image after exposure. Useful dyes for such purpose include monoazo, diazo, methine, anthraquinone, triarylmethane, thiazine, xanthene, phthalocyanine, azine, cyanine and leuco dyes as described, for example, in U.S. Pat. Nos. 3,929,489 and 4,139,390 and references noted therein. Such dyes are present in amounts readily determined by a person of ordinary skill in the art.

It is recognized that the radiation-sensitive composition of this invention can become crosslinked prior to intended exposure if the compositions or printing plates of this invention are stored at elevated temperatures, in areas permitting exposure to some quantity of actinic radiation and/or for extended periods of time. To insure against crosslinking the composition inadvertently before intended exposure to actinic radiation, stabilizers can be incorporated into the radiation-sensitive compositions and printing plates of this invention. Useful stabilizers include picoline N-oxide; phenols, such as 2,6-di-tert-butyl-p-cresol, 2,6-di-tert-butylanisole and p-methoxyphenol; hydroquinones such as hydroquinone, phloroglucinol and 2,5-di-tert-butylhydroquinone; triphenylmetallics, such as triphenylarsine; triphenylstilbene; and tertiary amines, such as N-methyldiphenylamine.

Still other addenda useful in the printing plates of this invention include antioxidants, surfactants, anti-scumming agents, and others known in the art.

Binders or extenders can optionally be incorporated into the radiation-sensitive composition. Such binders or extenders can be present in an amount within the range of from 0 to about 50 percent (by weight) based on total dry composition weight. Suitable binders include styrene-butadiene copolymers; silicone resins; styrene-alkyd resins; silicone-alkyd resins; soya-alkyd resins; poly(vinyl chloride); poly(vinylidene chloride); vinylidene chlorideacrylonitrile copolymers; poly(vinyl acetate); vinyl acetate-vinyl chloride copolymers; poly(vinyl acetals), such as poly(vinyl butyral); polyacrylic and -methacrylic esters, such as poly(methyl methacrylate), poly(n-butyl methacrylate) and poly(isobutyl methacrylate); polystyrene; nitrated polystyrene; polymethylstyrene; isobutylene polymers; polyesters, such as poly(ethylene-coalkaryloxy-alkylene terephthalate); phenolformaldehyde resins; ketone resins; polyamides; polycarbonates; polythiocarbonates; poly(ethylene 4,4'-isopropylidenediphenylene terephthalate); copolymers of vinyl acetate such as poly(vinyl-m-bromobenzoate-co-vinyl acetate); ethyl cellulose, poly(vinyl alcohol), cellulose acetate, cellulose nitrate, chlorinated rubber and gelatin. Methods of making binders or extenders of this type are well known in the prior art. A typical resin of the type contemplated for use is Piccolastic A50 ™, commercially available from Hercules, Inc., Wilmington, Del. Other types of binders which can be used include such materials as paraffin and mineral waxes.

The invention is further illustrated by the following examples of its practice.

EXAMPLE 1

Coating compositions useful in preparing lithographic printing plates were prepared in accordance with the following formulations:

| | Component | Amounts (grams) | |
|---|---|---|---|
| | | Composition 1 | Composition 2 |
| (1) | Polymer A (15% by weight solution in 1,2-dichloroethane) | 144.16 | |
| (2) | Polymer B (15% by weight solution in 1,2-dichloroethane) | | 144.15 |
| (3) | MONASTRAL Red pigment (7% by weight dispersion in 1,2- | 52.13 | 51.54 |

|   | Component | Amounts (grams) | |
|---|---|---|---|
|   |   | Composition 1 | Composition 2 |
|   | chloroethane) | | |
| (4) | 2-[Bis(2-furoyl)methylene-1-methyl-naptho[1,2-d]thiazoline | 0.63 | |
| (5) | 3,3'-Carbonylbis(5,7-di-n-propoxycoumarin) | | 1.03 |
| (6) | 2,6-Di-t-butyl-p-cresol | 0.60 | 0.68 |
| (7) | N-(4-Chlorobenzenesulfonyloxy)-1,8-naphthalimide | 1.77 | 1.14 |
| (8) | Dihydroanhydropiperidinohexose reductone | 0.08 | 0.02 |
| (9) | Leuco propyl violet | 0.46 | 0.28 |
| (10) | MODAFLOW coating aid* | 0.02 | |
| (11) | FC-430 surfactant** | | 0.15 |
| (12) | 1,2-Dichloroethane | 597.06 | 597.06 |

*MODAFLOW coating aid is a copolymer of ethyl acrylate and 2-ethylhexyl acrylate manufactured by Monsanto Corporation.
**FC-430 surfactant is a mixture of fluoroaliphatic polymeric esters manufactured by Minnesota Mining and Manufacturing Company.

In the above formulations, (1) and (2) serve as film-forming polymers, (3) serves as a colorant, (4) and (5) serve as spectral sensitizers, (6) serves as a stabilizer, (7) serves as a photooxidant, (8) serves as an antioxidant, (9) serves as a print-out dye, (10) and (11) serve as coating aids and (12) serves as a solvent.

A control coating was prepared by incorporating polystyrene resin (available under the trademark Piccolastic A-50 from Hercules, Inc.) in Composition 1 in an amount of 15.3% of the total polymer content. Compositions within the scope of the present invention were prepared by incorporating PEOX 50 polymer in Compositions 1 and 2 in an amount of 15.3% of the total polymer content.

Each composition was used to prepare a lithographic printing plate by coating it over a phosphoric-acid-anodized aluminum substrate provided with a thin carboxymethyl cellulose subcoat. Each coating was baked for 2 minutes at 100° C. as an accelerated aging test. The coatings that contained the PEOX 50 polymer resin could be imaged and developed cleanly after the bake treatment, while the comparison coating that contained the polystyrene resin left a heavy coating residue on the substrate under the same conditions. These results demonstrate the ability of a poly(N-acyl-alkyleneimine) to improve the shelf-life of the radiation-sensitive photopolymer coatings without having to resort to the use of treatments with heavy metal salts such as zinc acetate. Similar improved results are also obtained with a radiation-sensitive composition containing Polymer C.

EXAMPLE 2

A lithographic printing plate similar to that described in Example 1 was prepared using Composition 2. A second plate was prepared in which PEOX 250 polymer was incorporated in the radiation-sensitive layer in an amount of 10 percent by weight based on total polymer content. The plates were immersed in a developing solution consisting of 3 parts water and 1 part of a developer concentrate of the formula:

| Ingredient | Percent |
|---|---|
| 2-(2-ethoxyethoxy)ethanol | 16.0 |
| benzyl alcohol | 7.5 |
| diethanolamine | 5.1 |
| poly (vinyl pyrrolidone) | 1.0 |
| AEROSOL OT* | 0.1 |
| water | 70.3 |
|   | 100.0 |

*Dioctyl ester of sodium sulfosuccinic acid manufactured by American Cyanamid Company.

After standing 90 seconds, the developing solutions were briefly agitated and then examined. The coating containing Polymer B remained intact, but slowly peeled away from the anodized aluminum substrate on standing in the diluted developing solution. The coating containing the mixture of Polymer B and 10% PEOX 250 polymer immediately disintegrated as fine particles on agitation of the dilute developing solution. This demonstrates the ability of a poly(N-acyl-alkyleneimine) to improve the aqueous processability of lithographic printing plates. Comparison of the plate prepared with Polymer B and the plate prepared with a mixture of Polymer B and 10% PEOX 250 polymer under machine processing conditions using one part of the above-described concentrate diluted with one part of water also demonstrated that break-through and clean-up were much more rapid with the plate containing the mixture of Polymer B and 10% PEOX 250 polymer.

EXAMPLE 3

Several thousand linear meters of anodized aluminum were flow coated with a radiation-sensitive composition containing Polymer B and 10% of PEOX 250 polymer. The resulting coatings were observed to be remarkably smooth and substantially free of any coating mottle. Coatings produced under identical conditions without the PEOX 250 polymer additive showed perceptible mottle.

EXAMPLE 4

Lithographic printing plates similar to that described in Example 1 were prepared from the following radiation-sensitive compositions:
(1) Polymer B plus 10% PVP [poly(N-vinyl-2-pyrrolidone)]
(2) Polymer B plus 15% PVP
(3) Polymer B plus 6% PEOX 250 polymer
(4) Polymer B plus 12% PEOX 250 polymer The plates were immersed for 90 seconds in a developing solution and then rinsed with water. The developing solution was prepared by mixing one part of water with one part of a concentrate of the formula:

| Ingredient | Percent |
|---|---|
| benzyl alcohol | 4.50 |
| CARBOWAX 350* | 6.00 |
| diethanolamine | 5.00 |
| POLYWET Z-1766** | 0.10 |
| poly(vinyl pyrrolidone) | 1.00 |
| BELCLENE 200*** | 0.05 |
| water | 83.35 |
|   | 100.00 |

*Polyethylene glycol, manufactured by Union Carbide Corporation.
**Sodium salt of a polyfunctional acrylic oligomer, manufactured by Uniroyal Chemical.
***Polymaleic acid, manufactured by Ciba-Geigy Corporation.

The unexposed coatings containing 10% or 15% PVP remained intact, the coating containing 6% PEOX 250 polymer was partially removed, and the coating containing 12% PEOX 250 polymer was completely developed away. These results demonstrate that PEOX 250 polymer makes photopolymer compositions processable in developing solutions containing more than 90% water at polymer loadings below those at which PVP is effective. The exceptional processing benefits derived from the addition of PEOX 250 polymer are believed to be related to the fact that PEOX 250 polymer is compatible with Polymer B, i.e., no phase separation occurs.

EXAMPLE 5

Incubation tests were carried out to determine the effectiveness of N-acyl-alkyleneimine polymers in providing and maintaining high contrast. In carrying out these tests, printing plates were prepared by coating the photosensitive formulation described in Example 1 as Composition 1, containing additives as indicated below, onto phosphoric acid-anodized aluminum in an amount sufficient to provide a Polymer A coverage of 810 milligrams per square meter. The contrast of each coating was determined from its sensitometric response immediately after coating and again after incubation for two weeks at 50° C. All coatings were processed with Kodak Aqueous Plate Developer MX-1469-1, available from Eastman Kodak Company, Rochester, N.Y.

The results obtained are indicated in Table I below.

TABLE I

| Test | Additive | Coating Wt. (mg/m$^2$) | Fresh Contrast | Incubated Contrast |
|---|---|---|---|---|
| Control A | none | — | 1.20 | 0.83 |
| Control B | polystyrene | 146 | 0.88 | 0.68 |
| Example 1 | PEOX 50 | 146 | 0.97 | 1.03 |

Thus, the control examples exhibited a 20 to 30% drop in contrast on aging, whereas the coating with the PEOX 50 additive showed no loss in contrast under the same conditions.

The poly(N-acyl-alkyleneimines) are both solvent soluble and water soluble. These solubility characteristics render them especially advantageous for use in the present invention since they facilitate both coating from solvent solution to form the radiation-sensitive layer and subsequent development by the use of "aqueous" developing solutions, i.e., developing solutions which are predominantly water but do contain small amounts of organic solvent. Incorporation of a poly(N-acyl-alkyleneimine) in the radiation-sensitive composition permits the use of lower concentrations of organic solvent in the aqueous developing solution, as compared with an otherwise identical composition that does not contain the poly(N-acyl-alkyleneimine). Also, significantly less mottle results when the poly(N-acyl-alkyleneimine) is employed and higher contrast images are achieved.

Current trends in the lighographic printing plate industry favor the use of "aqueous developers." By this is meant that the developer used to process the printing plate, either by hand or by machine, contains little or no organic solvent and that any organic solvent which is present is nontoxic and a high boiling material with a very low vapor pressure. Other ingredients included in the developer, such as salts and surfactants, are nontoxic and biodegradable. The present invention is especially well adapted, by virtue of the polymeric materials incorporated in the radiation-sensitive composition, for use with such "aqueous developers."

The invention has been described in detail with particular reference to preferred embodiments thereof, but it will be understood that variations and modifications can be effected within the spirit and scope of the invention.

We claim:

1. A negative-working lithographic printing plate comprising a support having thereon a radiation-sensitive layer of a composition comprising a mixture of (A) a photocrosslinkable polymer containing the photosensitive group

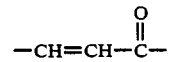

as an integral part of the polymer backbone and (B) a poly(N-acyl-alkyleneimine).

2. A negative-working lithographic printing plate as claimed in claim 1, wherein said support is an anodized aluminum support.

3. A negative-working lithographic printing plate as claimed in claim 2, including a subbing layer between said anodized aluminum support and said radiation-sensitive layer.

4. A negative-working lithographic printing plate as claimed in claim 2, wherein said poly(N-acyl-alkyleneimine) is comprised of repeating units of the formula:

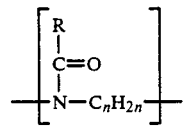

wherein R is a monovalent hydrocarbyl radical containing up to 20 carbon atoms and n is an integer with a value of 2 to 4.

5. A negative-working lithographic printing late as claimed in claim 2, wherein said poly(N-acyl-alkyleneimine) is an N-acylated polyethyleneimine.

6. A negative-working lithographic printing plate as claimed in claim 2, wherein said poly(N-acyl-alkyleneimine) is poly(2-ethyl-2-oxazoline).

7. A negative-working lithographic printing plate as claimed in claim 2, wherein said poly(N-acyl-alkyleneimine) is present in said radiation-sensitive layer in an amount of from about 2 to about 30 percent by weight based on total polymer content.

8. A negative-working lithographic printing plate as claimed in claim 2, wherein said poly(N-acyl-alkyleneimine) is present in said radiation-sensitive layer in an amount of from about 5 to about 15 percent by weight based on total polymer content.

9. A negative-working lithographic printing plate as claimed in claim 2, wherein said photocrosslinkable polymer is a p-phenylene diacrylate polyester.

10. A negative-working lithographic printing plate comprising an anodized aluminum support having thereon a radiation-sensitive layer of a composition comprising a mixture of (A) a photocrosslinkable polymer comprised of recurring units of the formula:

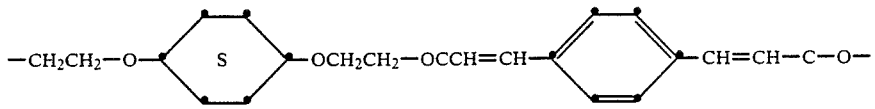

and (B) poly(2-ethyl-2-oxazoline).

11. A negative-working lithographic printing plate comprising an anodized aluminum support having thereon a radiation-sensitive layer of a composition comprising a mixture of (A) poly[1,4-cyclohexylene-bis(oxyethylene)-p-phenylenediacrylate]-co-3,3'-[(sodioimino)disulfonyl]dibenzoate and (B) poly(2-ethyl-2-oxazoline).

12. A negative-working lithographic printing plate comprising an anodized aluminum support having thereon a radiation-sensitive layer of a composition comprising a mixture of (A) poly[1,4-cyclohexylene-bix(oxyethylene)-p-phenylenediacrylate]-co-3,3'-[(sodioimino)disulfonyl]dibenzoate-co-3-hydroxyisophthalate and (B) poly(2-ethyl-2-oxazoline).

* * * * *